United States Patent [19]
Wilcox

[11] 3,803,516
[45] Apr. 9, 1974

[54] ELECTRONIC SWITCHING CIRCUIT

[75] Inventor: Milton E. Wilcox, Tempe, Ariz.
[73] Assignee: Motorola, Inc., Franklin Park, Ill.

[22] Filed: Feb. 7, 1973
[21] Appl. No.: 330,408

[52] U.S. Cl. .......... 331/111, 331/108 D
[51] Int. Cl. .......... H03k 3/26
[58] Field of Search .......... 331/108 C, 108 D, 111, 331/143

[56] References Cited

UNITED STATES PATENTS 3,688,220 8/1972 Gay .......... 331/111

*Primary Examiner*—John Kominski

[57] ABSTRACT

A monolithic integrated sawtooth oscillator includes an electronic switching circuit for controlling the charging and discharging of a capacitor through a pair of current sources, one of which is used to charge the capacitor and the second of which operates to remove charge from the capacitor when the switching circuit is rendered operative. The second current source includes a transistor which is normally nonconductive and is switched into conduction by the operation of a differential circuit when a predetermined charge relative to a reference potential is attained by the capacitor. When the capacitor becomes nearly fully discharged, the second current source transistor becomes saturated to starve current from a control circuit to turn off the switching circuit and further operates to clamp the discharge potential of a capacitor to a point very near ground or reference potential.

8 Claims, 2 Drawing Figures

ELECTRONIC SWITCHING CIRCUIT

BACKGROUND OF THE INVENTION

Solid state, free-running, triangle waveform or sawtooth oscillators have been fabricated in monolithic integrated circuit configurations. Unless positive and negative voltage sources and complex switching circuits are used, however, the switching circuits employed in such oscillators are not capable of discharging the timing or saw-forming capacitor to a level which is very close to the ground or reference potential to which the capacitor is connected. To obtain the maximum stability of operation of an oscillator of this type, it is desirable that the starting point for charging the capacitor be as close to ground or the reference potential as possible. Further, if the starting point is made close to ground potential, a greater voltage swing of the output waveform can be obtained from a given voltage source than is possible if the starting point for the capacitor charge is at some significant voltage above the reference potential.

SUMMARY OF THE INVENTION

Accordingly, it is an object of this invention to provide an improved electronic switching circuit.

It is an additional object of this invention to provide an improved switching circuit for discharging a capacitor.

It is a further object of this invention to utilize a saturation-operated switch for discharging a capacitor.

It is another object of this invention to provide an improved sawtooth oscillator circuit.

In accordance with a preferred embodiment of this invention, a switching circuit for discharging a capacitor substantially to a reference potential includes a first normally nonconductive transistor with its collector-emitter path connected in series from the capacitor and through a first resistor to the point of reference potential. A diode and a second resistor having a value greater than the value of the first resistor are connected in series in the forward current-conducting direction between the base of the first transistor and the point of reference potential. Current is supplied to the diode from a current source transistor which is switched between conduction and nonconduction. This junction of the base of the first transistor with the diode also is coupled to the base of a second transistor, having its emitter connected through a resistor of the same value as the second resistor to the point of reference potential. The collector of the second transistor is coupled to the base of the current source transistor and through a constant current source to a source of operating potential.

A circuit is provided for rendering the current source transistor conductive to conduct a greater current than that of the constant current source and to supply this current through the series connection of the diode and the second resistor. This in turn causes a discharging current to flow through the first transistor from the capacitor and also causes the second transistor to maintain the current source transistor conductive. When the capacitor discharges to near the point of reference potential, the first transistor saturates and starves the base current of the second transistor. The conductivity of the second transistor then is reduced to a point where the constant current source biases the current source transistor to nonconduction. When this happens, the circuit resumes a state of operation in which the current source transistor and the first and second transistors are nonconductive.

DETAILED DESCRIPTION

Figure 1:
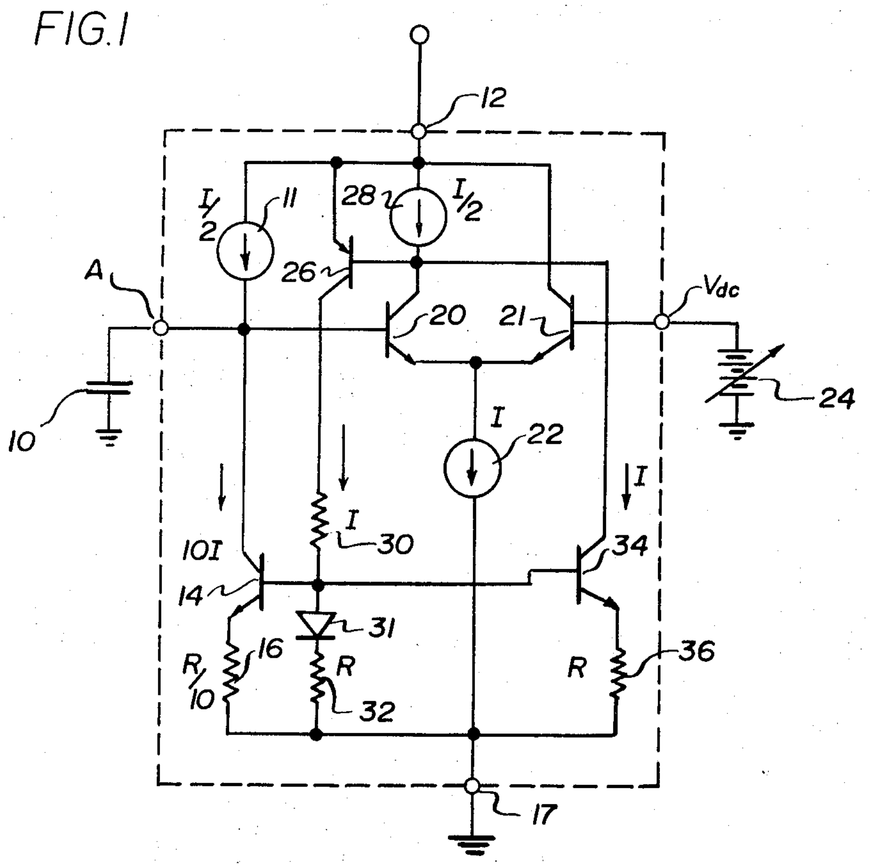
FIG. 1 is a circuit diagram of a preferred embodiment of the invention.
Figure 2:
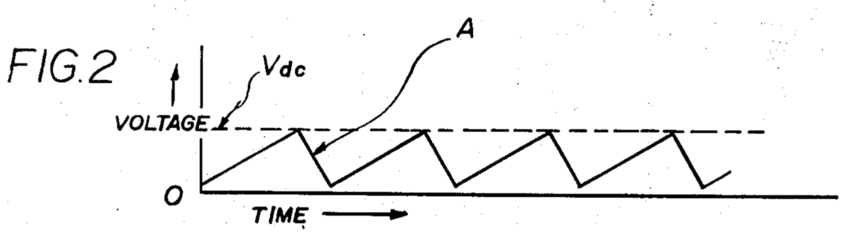
FIG. 2 illustrates waveforms useful in describing the operation of the circuit shown in FIG. 1.

Referring now to FIG. 1, there is shown a sawtooth oscillator circuit fabricated in monolithic integrated circuit form. The portions of the circuit formed on the integrated circuit chip are enclosed in dotted lines. An external timing capacitor 10 is charged from a first current source 11 which supplies current having a value of I/2 to the capacitor 10 from a voltage supply terminal or bonding pad 12 connected to a source of positive operating potential (not shown). The current value I/2 is selected merely for purpose of illustration in explaining the operation of the circuit shown in FIG. 1. It should be noted that this current value, as it is related to the other current values to be described subsequently, is not to be considered restrictive or limiting. Since the capacitor 10 is charged from a constant current source, the potential or charge stored by the capacitor 10 rises in a linear fashion established by the parameters of the current source 11. This linear rise in potential is illustrated in FIG. 2 and comprises the rising portion of the sawtooth waveform A.

A discharge path is provided for the capacitor 10 through the collector-emitter path of an NPN transistor 14, the collector of which is connected to the capacitor 10, and the emitter of which is connected through a resistor 16, having a value R/10, to a grounded bonding pad 17. The value, R/10, of the resistor 16 also is selected for purposes of illustration in the description of the operation of the circuit. The resistor 16 may be of any suitable value, so long as the current drawn by the transistor 14, when it conducts, exceeds the current supplied by the constant current source 11. This is necessary to permit a discharge of the capacitor 10, since no discharge would be effected if the transistor 14 did not draw a greater current than that which is supplied by the current source 11.

The transistor 14 is normally nonconductive, so that the only operative connection to the capacitor 10 then is through the charging current source 11. To initiate a discharge cycle for the capacitor 10, a differential switch comprising a pair of NPN transistors 20 and 21 is provided. The emitters of these transistors are connected in common through a constant current source 22 supplying a current I to the grounded bonding pad 17. The base of the transistor 21 is supplied with a DC reference potential from a variable DC source 24. This reference potential $V_{DC}$ is shown in dotted lines in FIG. 2 and comprises the upper limit of the charge attained by the capacitor 10. The base of the transistor 20 is coupled to the common junction of the capacitor 10, the collector of the transistor 14, and the current source 11; so that the charge on the capacitor comprises the bias for the transistor 20 of the differential switch.

So long as the charge on the capacitor 10 is a voltage which is less than $V_{DC}$, the transistor 21 of the differential switch is conductive and the transistor 20 is nonconductive. Thus, the full current I provided by the current source 22 flows from the voltage supply bonding pad 12 through the transistor 21. A PNP current source transistor 26 has its emitter coupled to the voltage supply bonding pad 12 and its base coupled to the collector of the transistor 20. A constant current source 28 supplies current of value I/2 from the bonding pad 12 to the junction of the collector of transistor 20 with the base of the transistor 26. So long as the transistor 20 is nonconductive, the current source 28 forces the PNP transistor 26 also to be nonconductive.

When the charge on the capacitor 10 reaches the value $V_{DC}$, the transistor 20 of the differential switching circuit is rendered conductive and the transistor 21 becomes nonconductive. The transistor 20 then conducts the full current I from the current source 22. Only part of this current, I/2, is supplied by the current source 28. The remainder of the current I is supplied through the base-emitter circuit of the transistor 26, causing the transistor 26 to be driven to saturation to supply a current I from its collector through a series circuit including a resistor 30, diode 31 and a resistor 32 (having a resistance R) to the grounded bonding pad 17. The junction of the anode of the diode 31 with the resistor 30 is connected to the base of the transistor 14 and to the base of an additional NPN transistor 34 and controls the conduction of the transistors 14 and 34.

The transistor 34 is connected to the grounded bonding pad 17 through a resistor 36 (having a resistance R). As is well-known, the current I flowing through the diode 31 and resistor 32 also causes the same value of current to flow through the transistor 34 since the resistors 32 and 36 have the same values. Thus, the transistor 34 latches the transistor 26 into its conductive state, even though the charge on the capacitor 10 immediately begins decreasing below the value $V_{DC}$ to cause the state of the differential switch 20, 21 to revert to its initial condition with the transistor 21 conductive and the transistor 20 nonconductive.

At the same time, the transistor 14 conducts a current of 10 I since, in the example shown, the resistor 16 has a value which is one-tenth that of the resistor 32. Thus, the capacitor 10 is rapidly discharged through the transistor 14 toward ground potential.

When the capacitor voltage reaches nearly ground potential, thereby reducing the potential on the collector of the transistor 14 to a very low level, the transistor 14 saturates. This saturation of the transistor 14 loads the bias network comprised of the diode 31 and the resistor 32 and starves current from the base of the transistor 34, reducing its conductivity. This reduction is very rapid and reduces the current through the transistor 34 rapidly below the value I/2. When this occurs, the current supplied by the constant current source 28 once again reverse biases the transistor 26, rendering it nonconductive since the transistor 20 already is nonconductive at this time. When the transistor 26 ceases conduction, both transistors 14 and 34 are rendered nonconductive, and the next charge cycle of the capacitor 10 is initiated. Charge then commences building up on the capacitor 10 at a rate determined by the rate of current supplied by the constant current source 11.

Due to the saturation of the transistor 14 near the end of the discharge cycle for the capacitor 10, the voltage on the collector of the transistor 14 becomes very close to ground potential; so that the extreme negative points of the sawtooth waveform A (FIG. 2) on the capacitor 10 can be clamped to approximately 200 millivolts above ground.

When the oscillator circuit shown in FIG. 1 is used as the vertical deflection oscillator for a television receiver, the waveform on the capacitor 10 may be used as the output and is buffered and DC coupled to a class A output amplifier stage. By varying the potential of the $V_{DC}$ supplied by the variable voltage source 24, the frequency of the oscillator can be changed. It is also possible to inject a negative synchronizing pulse on the base of the transistor 21 to trigger the oscillator into operation at the required frequency. When this is done the variable voltage supply 24 serves as a "vertical hold" control, and a simple potentiometer connected between the output of the oscillator at A and the output amplifier stage can be used to vary the height.

The scaling of the currents flowing through the diode 31 and the transistor 14 has been illustrated in accordance with scaling of the relative values of the resistors 16 and 32. It also is apparent that similar scaling can be accomplished by different emitter areas of the transistor 14 and of the diode 31, which in integrated circuit form is fabricated as a transistor with the base-collector electrodes shorted together. If the currents are scaled by using different emitter areas the extreme negative points of the sawtooth waveform A can be reduced to a potential which is 50 mV above ground since the voltage drop across the emitter resistor R16 has been removed.

I claim:

1. An electronic switching circuit for discharging a capacitor substantially to a reference potential including in combination:

a first normally nonconductive transistor with the collector-emitter path thereof connected in series circuit between the capacitor and a point of reference potential;

diode means coupled in the forward current conducting direction from a first junction with the base of said first transistor to the point of reference potential;

a voltage supply terminal for connection with a source of operating potential;

a normally nonconductive current source transistor with the collector-emitter path thereof coupled between said voltage supply terminal and the first junction;

a first constant current source connected between said voltage supply terminal and the base of said current source transistor at a second junction;

a second normally nonconductive transistor with the collector-emitter path coupled in series circuit between the second junction and the point of reference potential, the base of said second transistor coupled with said first junction; and means for rendering said current source transistor conductive to supply current therethrough in excess of the value of current from said first constant current source, current supplied from said current source transistor through said diode means causing said first and second transistors to be rendered conductive, said first transistor providing a discharge path for the capacitor and said second transistor conducting current in excess of that supplied by said first constant current source means to maintain said current source transistor conductive, said first transistor becoming saturated upon discharge of said capacitor substantially to the reference potential, thereupon starving the current supplied from said first junction to the base of said second transistor to reduce the conductivity thereof sufficiently that said first constant current source renders said current source transistor nonconductive, whereupon both of said first and second transistors also are rendered nonconductive.

2. The combination according to claim 1 wherein said first and second transistors are of one conductivity type and said current source transistor is of the opposite conductivity type, with the emitter of said current source transistor coupled with said voltage supply terminal and wherein said first constant current source is coupled to conduct current in the same direction with respect to said voltage supply terminal as said current source transistor.

3. The combination according to claim 1 wherein said diode means includes a diode and a first resistor, having a value R, connected in series circuit between said first junction and the point of reference potential; the collector of said first transistor is coupled with the capacitor; a second resistor having a value $R/n$, where n is an integer greater than 1, is coupled between the emitter of said first transistor and the point of reference potential; the collector of said second transistor is coupled with said second junction; and a third resistor having a value R is connected between the emitter of said second transistor and the point of reference potential.

4. The combination according to claim 3 wherein said first and second transistors are NPN transistors and said current source transistor is a PNP transistor.

5. The combination according to claim 1 wherein said means for initially turning on said current source transistor comprises at least a first switching transistor and a second constant current source, said second constant current source providing current in excess of the current provided by said first constant current source, the collector-emitter path of said first switching transistor coupled in series with said second constant current source, in the order named, between said second junction and the point of reference potential.

6. The combination according to claim 5 further including a second switching transistor connected in a differential circuit with said first switching transistor, the collector of said second switching transistor coupled with said voltage supply terminal and the emitter of said second switching transistor coupled in common with the emitter of said first switching transistor and said second constant current source at a third junction, the base of said second switching transistor coupled with a source of reference potential and the base of said first switching transistor coupled with said capacitor.

7. The combination according to claim 6 further including a third constant current source coupled between said voltage supply terminal and said capacitor for providing a charging path from said voltage supply terminal to said capacitor with said first transistor nonconductive.

8. The combination according to claim 7 wherein said first and second transistors are NPN transistors, said first and second switching transistors are NPN transistors and said current source transistor is a PNP transistor; said diode means comprises a diode and a first resistor of value R connected in series between said first junction and the point of reference potential; and further including a second resistor having value $R/n$, where n is a positive integer greater than 1, connected between the emitter of said first transistor and the point of reference potential; and a third resistor, having a value R, connected between the emitter of said second transistor and the point of reference potential so that said switching circuit operates as a free-running oscillator in response to the charging and discharging of said capacitor.

* * * * *